United States Patent [19]

Ryan

[11] Patent Number: 4,646,005
[45] Date of Patent: Feb. 24, 1987

[54] SIGNAL PROBE

[75] Inventor: Carl R. Ryan, Gilbert, Ariz.

[73] Assignee: Motorola, Inc., Schaumburg, Ill.

[21] Appl. No.: 590,097

[22] Filed: Mar. 16, 1984

[51] Int. Cl.⁴ .................. G01R 1/30; G01R 31/02
[52] U.S. Cl. .................. 324/123 R; 324/158 P; 324/72.5
[58] Field of Search .............. 324/123 R, 124, 158 P, 324/149, 72.5, 115, 73 R; 343/703

[56] References Cited

U.S. PATENT DOCUMENTS

| | | | |
|---|---|---|---|
| 2,476,115 | 7/1949 | Runbaken | 324/72.5 |
| 2,881,400 | 4/1959 | Rogers | 324/149 |
| 2,883,619 | 4/1959 | Kobbe et al. | 324/149 |
| 4,066,953 | 1/1978 | Gold | 324/123 R |

FOREIGN PATENT DOCUMENTS

| | | | |
|---|---|---|---|
| 2430619 | 3/1980 | France | 324/72.5 |
| 0048376 | 4/1977 | Japan | 324/158 P |

OTHER PUBLICATIONS

"Allied Industrial Electronics Catalog 1967"; Allied Electronics; 1967; pp. 1, 409.

Primary Examiner—Reinhard J. Eisenzopf
Assistant Examiner—Vinh P. Nguyen
Attorney, Agent, or Firm—Raymond J. Warren

[57] ABSTRACT

A signal probe that does not require a direct ground contact is disclosed. The probe consists of a resistive measuring tip, an amplifier and a probe body which acts as an antenna providing a ground reference for the probe. The frequency of the signal measured may be compensated for by adjusting the resistive tip in the probe which varies the shunt capacitance between the resistor and the probe body.

9 Claims, 7 Drawing Figures

SIGNAL PROBE

BACKGROUND OF THE INVENTION

1. Field of the Invention

This invention relates, in general, to a signal probe, and more particularly, to an indirectly grounded signal probe for use in measuring DC and AC up to several GHz frequency.

2. Description of the Background

There are many signal probes known in the prior art. However, all of the prior art probes require some type of direct ground connection whether it be by separate connector or by using the body of the person using the probe (U.S. Pat. No. 4,066,953).

SUMMARY OF THE INVENTION

Accordingly, it is an object of the invention to provide an apparatus and method that does not require a direct ground to effectively operate.

A further object of the present invention is to provide an apparatus and method that is more economical to produce and operate.

Still another object of the present invention is to provide an apparatus and method for frequency compensation in measurements.

Yet another object of the present invention is to provide an apparatus and method having an economically improved tip design.

The above and other objects and advantages of the present invention are provided by an apparatus and method of testing line signals without requiring a direct ground contact.

A particular embodiment of the present invention comprises an apparatus and method for testing line signals without requiring the use of a direct ground connection. This is accomplished through the use of a probe having a greatly increased input impedance, thus, the loading effect on the circuit under test is correspondingly reduced. A probe tip that is easily replaceable is inserted in the end of the probe. Contained in the probe is circuitry for compensating and amplifying the signal measurements. In this particular embodiment the body of the probe is used as an antenna to provide a ground reference for the device.

DETAILED DESCRIPTION OF THE INVENTION

Figure 1:
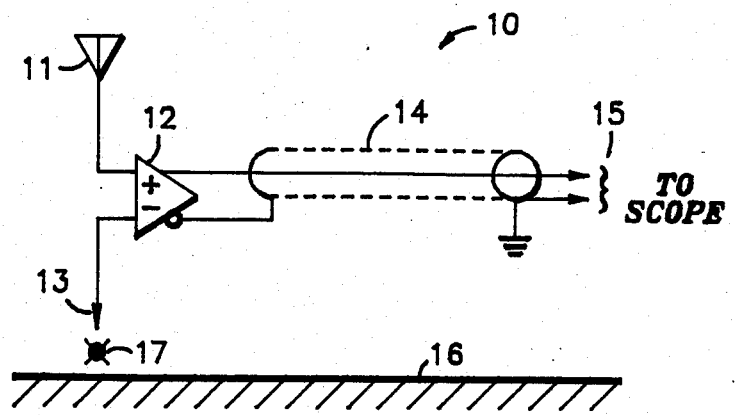
FIG. 1 is a block diagram of the basic concept of a probe embodying the present invention.

Referring now to FIG. 1, a block diagram of the basic concept of a probe, generally designated 10, embodying the present invention is illustrated. The basic concept behind the indirectly grounded signal probe is to make the antenna effect of the probe body serve as the ground reference. Here the device is illustrated as having a probe body 11, an amplifier 12 and a tip 13. A probe cable 14 is coupled to probe 10 and links probe 10 to a scope 15, or other measuring device. Tip 13 is placed on a point 17 to be tested. A ground plane 16 is the ground relative to the signal at point 17. This procedure, as illustrated below, performs satisfactorily when the input impedance of the probe is much greater than the antenna impedance.

Figure 2:
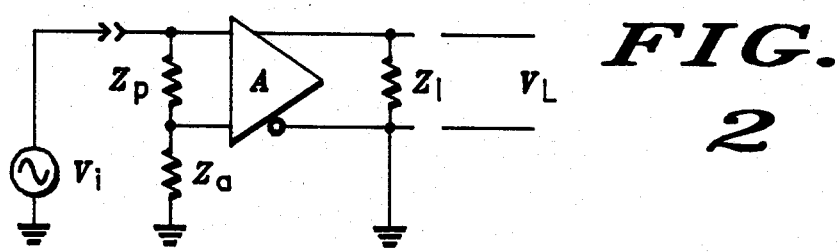
FIG. 2 is the equivalent schematic diagram of the probe of FIG. 1.

Referring now to FIG. 2, a schematic diagram of the probe of FIG. 1 is illustrated. Here $Z_p$ is the input impedance of probe 10; A is assumed to be a perfect amplifier with a voltage gain of A; $Z_a$ is the antenna impedance relative to the ground plane; and $Z_l$ is the load impedance. From this circuit the load voltage, $V_L$, and is defined by the equation;

$$V_L = AV_i \frac{Z_p}{Z_a + Z_p} \qquad (1)$$

which reduces to:

$$V_L \approx AV_i \text{ if } Z_a << Z_p.$$

Figure 3:
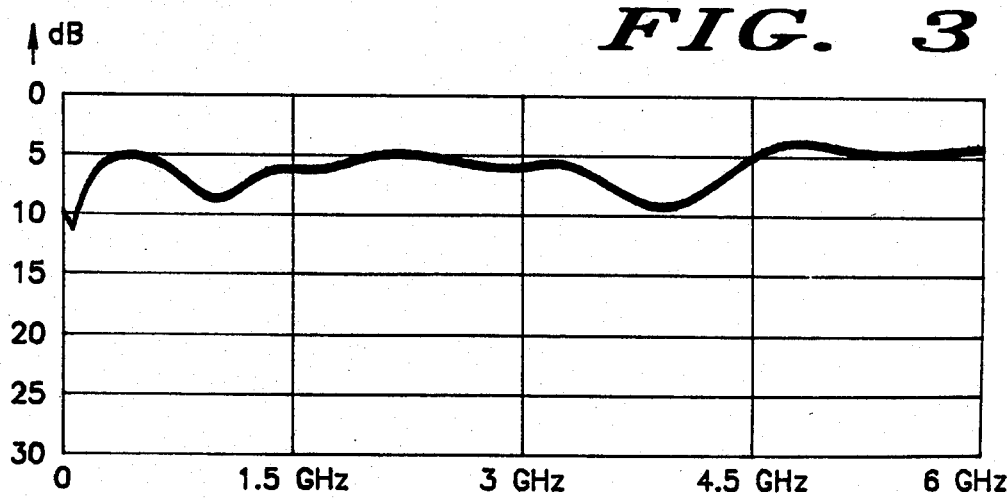
FIG. 3 is a graph of the reflection coefficient of a hand held probe embodying the present invention.

The probe body antenna impedance is affected by several factors: the diameter of the body; the length of the body; the proximity of the ground plane; the frequency of the signal; the loading factor; and the angle of the probe. Although analytical methods to determine the above could be derived the method used in the present case was to design a probe and measure the parameters. In FIG. 3, the measured result of a reflection coefficient of a probe embodying the present invention is illustrated. A reflection coefficient of greater than 6 dB can be maintained over the frequency range of 0 to 4 GHz. The 6 dB reflection coefficient corresponds to an effective antenna impedance of less than 150 ohms over the 0 to 4 GHz range. Using equation (1), above, to calculate the measurement error (ME) caused by a finite amplifier impedance and a non-zero antenna impedance results in the equation:

$$ME = \frac{AV_i - AV_i \left( \frac{Z_a}{Z_a + Z_p} \right)}{AV_i} \qquad (2)$$

which reduces to:

$$ME = \frac{Z_a}{Z_a + Z_p} \qquad (3)$$

Figure 4:
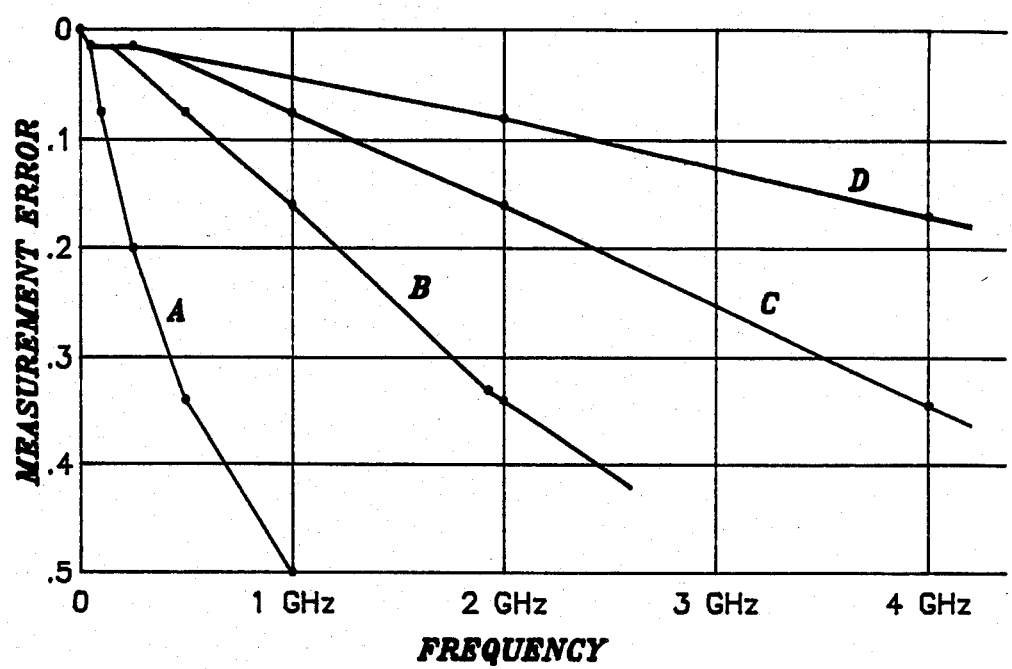
FIG. 4 is a graph of the measurement error for varying frequencies being measured with a probe embodying the present invention.

Referring now to FIG. 4 a graph of ME for varying frequencies is illustrated for a probe embodying the present invention. In FIG. 4, $Z_a$ is presumed to be 150 ohms and $Z_p$ is varied. Line A utilizes a 1.0 pf probe input impedance with infinite resistance which corresponds to commercially available FET probes, such as produced by Textronic ™. This will work satisfactorily as an indirectly grounded unit for signals less than 120 MHz, which is less than or equal to a 10% measurement error, but, is not intended for use in the indirectly grounded probe since it has provisions for direct ground connections near the probe tip. Line B has a 10K input impedance shunted by a 0.20 pf capacitance. Line C has a 10K input impedance shunted by a 0.10 pf capacitance. Line D has a 10K input impedance shunted by a 0.05 pf capacitance. As illustrated in FIG. 4 the measurement error is reduced as the capacitance decreases from 1 pf line A, to 0.05 pf, line D. As illustrated on line D signal waveforms of more than 2.5 GHz may be satisfactorily measured ($\leq 10\%$ ME). The range of measurement may be increased by compensating the error in the 2 to 4 GHz range. This compensation is accomplished by adding a small amount of peaking to the amplifier response.

Figure 5:
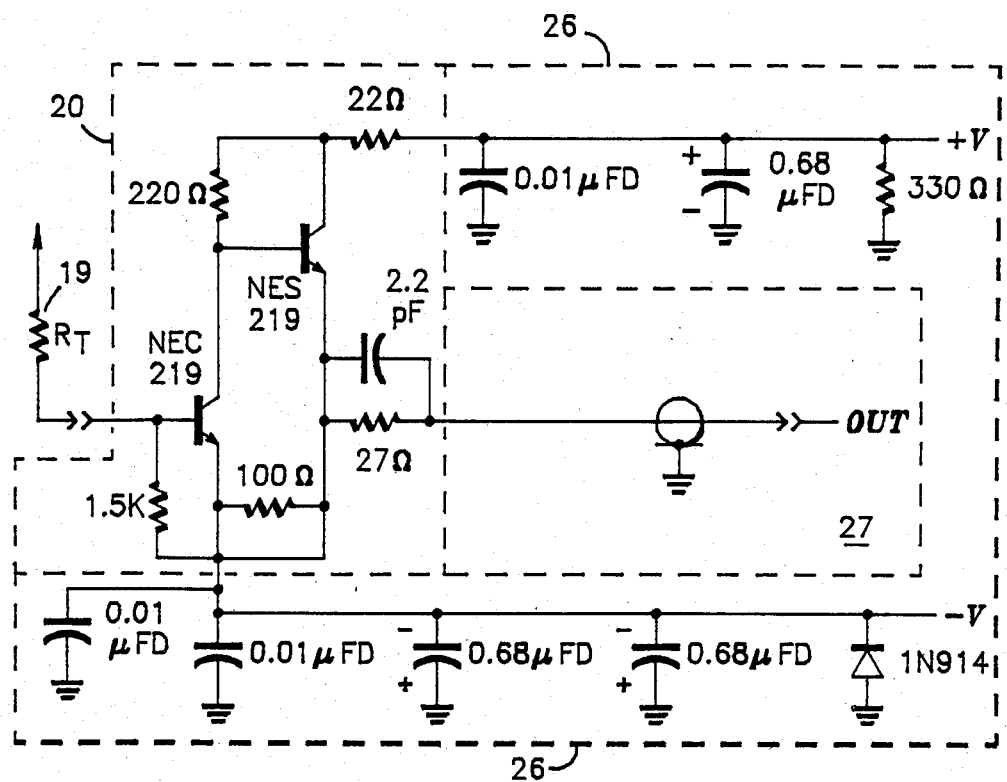
FIG. 5 is a schematic diagram of a wide band signal probe embodying the present invention.

FIG. 5 is a schematic diagram of a wide band signal probe, generally designated 18, embodying the present invention. FIG. 5 is comprised of a resistor 19 coupled to be used as the tip of probe 18; an amplifier 20; a power decoupling 26 which is coupled to a probe cable (not shown); and an antenna ground 27. Probe 18 encompasses the general requirements for the amplifier design which are: easily replaceable tips; not easily burnt out due to transient input voltages; dc coupled; low cost design; 50 ohm output impedance; and a selectable attenuation factor. The burnt out requirement and low cost design indicate that Si bipolar devices are preferable over GaAs FET active components. Probe 18 is basically an operational amplifier with $R_T$ and the 1.5K feedback resistance as the primary gain determining elements.

Amplifier 20 has provisions for minor frequency response adjustments. Resistor 19 can be modeled as a resistor in shunt with a small capacitor, this will be illustrated further in conjunction with FIG. 6. The shunt capacitance acts to control the frequency response. The actual value of the shunt capacity is determined by the construction technique used to make the probe. While numerous types and styles of resistors can be used the best type is a standard carbon composition resistor with a $\frac{1}{4}$ watt power rating.

Figure 6:
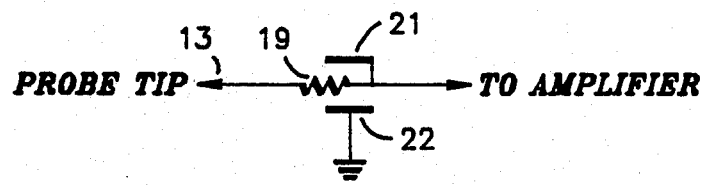
FIG. 6 is a portion of the schematic of FIG. 5 illustrating the tip of the probe.
Figure 7:
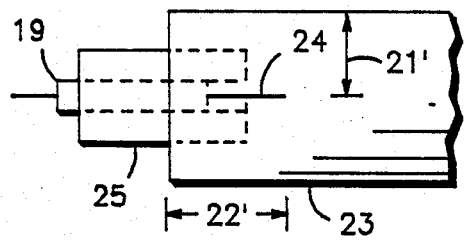
FIG. 7 is a side view with portions being broken away of a probe body, embodying the present invention, illustrating the tip of the probe.

Referring now to FIG. 6 a portion of the schematic of FIG. 5 is illustrated. This schematic shows probe tip 13 coupled to one end of resistor 19 ($R_t$). The other end of resistor 19 is coupled to amplifier 20 (not shown). Two shunt capacitances 21 and 22 are illustrated representing the shunt capacitance to the probe body and to the ground respectively. Frequency response compensation is achieved by a proper selection of resistor 19 in addition to the resistor location relative to the probe body and other shunt capacity. FIG. 7 is an exploded view of a probe body, generally designated 23, embodying the present invention. FIG. 7 shows probe body 23 with a holder 25 and a resistor 19 inserted into holder 25. The first shunt capacitance, 21 of FIG. 6, is determined by the distance from a lead wire 24 of resistor 19 to body 23 of the probe. This distance is represented by the number 21'. The second shunt capacitance, 22 in FIG. 6, is determined by the penetration of lead wire 24 into body 23 of the probe. This is represented by the number 22'.

The reactive portion of the probe input impedance is primarily the shunt capacitance to resistor 19 (above). The effective value of the shunt capacitance can be determined from a reflection coefficient measurement of the probe. For the present probe a reflective coefficient of less than 1 dB was achieved at 3 GHz indicating that the effective input capacitance is approximately 0.05 pf.

Thus, it is apparent that there has been provided, in accordance with the invention, a device and method that fully satisfies the objects, aims and advantages set forth above.

It has been shown that the present invention provides an apparatus and method that does not require a direct ground to effectively operate and is economical to produce and operate. It has also been shown that the present invention is capable of frequency compensation in its measurement.

While the invention has been described in conjunction with specific embodiments thereof, it is evident that many alterations, modifications, and variations will be apparent to those skilled in the art in light of the foregoing description. Accordingly, it is intended to embrace all such alternatives, modifications, and variations as fall within the spirit and broad scope of the appended claims.

I claim:

1. A signal measuring probe comprising:
   measuring tip means for receiving a signal;
   an amplifier coupled to said tip means;
   a body housing said amplifier and said tip means, said body being an antenna providing a ground reference for said probe; and
   frequency compensation means for compensating said signal, said frequency compensation means being determined by said measuring tip means placement with respect to said body housing.

2. The signal probe of claim 1 wherein said body comprises:
   a first portion housing said amplifier; and
   a second portion coupled to said first portion for adjustably housing said tip means.

3. The signal probe of claim 2 wherein said measuring tip means comprises a resistor having a first lead and a second lead, said second lead of said resistor and said resistor being inserted into said second portion of said body and penetrating into said first portion of said body.

4. The signal probe of claim 3 wherein said frequency compensation means comprises:
   a first shunt capacitance defined by said second lead of said resistor relative to said probe body; and
   a second shunt capacitance defined by the penetration of said resistor into said first portion of said body housing.

5. The signal probe of claim 4 wherein said resistor comprises a carbon composition resistor having a $\frac{1}{4}$ watt power rating.

6. A method of measuring a signal utilizing an ungrounded probe with an adjustable frequency response comprising the steps of:
   adjusting the frequency response of said probe;
   providing a circuit to be tested, said circuit having a test point;
   contacting said test point with a tip of said probe;
   providing a high input impedance to said probe;
   reducing the loading effect on said circuit;
   providing low input capacitance to said probe;
   utilizing an antenna effect of said probe as a ground for said probe; and
   providing an input impedance of said probe greater than an antenna impedance of said probe.

7. The method of claim 6 wherein said step of adjusting the frequency response to the said probe comprises the steps of:
   selecting a resistor to be used as said tip of said probe; and
   positioning said resistor in said probe.

8. A signal measuring probe comprising:

resistive measuring tip means for receiving a signal, said resistive measuring tip means including a resistor, a first lead, and a second lead;

an amplifier coupled to the second lead of said resistive measuring tip means;

a body having said resistive measuring tip means and said amplifier affixed thereto, said body being an antenna providing a ground reference for said probe;

a first shunt capacitance defined by said second lead of said resistor relative to said body; and a second shunt capacitance defined by the position of said resistor relative to said body.

9. The signal measuring probe of claim 8 wherein said resistor means comprises a carbon composition resistor having a ¼ watt power rating.

* * * * *